United States Patent [19]

Kooi, Johannes

[11] Patent Number: 5,041,359

[45] Date of Patent: Aug. 20, 1991

[54] METHOD FOR FORMING A PATTERNED PHOTOPOLYMER COATING ON A PRINTING ROLLER

[75] Inventor: Kooi, Johannes, Boxmeer, Netherlands

[73] Assignee: Stork Screens B.V., Boxmeer, Netherlands

[21] Appl. No.: 81,606

[22] Filed: Aug. 3, 1987

Related U.S. Application Data

[63] Continuation of Ser. No. 847,458, Apr. 3, 1986, abandoned.

[30] Foreign Application Priority Data

Apr. 3, 1985 [NL] Netherlands .......................... 8500992

[51] Int. Cl.$^5$ ........................... G03F 7/00; G03F 7/18
[52] U.S. Cl. .................................... 430/300; 430/306; 430/309; 430/327; 430/330; 430/394; 430/395; 430/396; 430/494; 430/502; 430/503
[58] Field of Search ............... 430/309, 327, 394, 395, 430/396, 494, 502, 503, 300, 302, 306, 330

[56] References Cited

U.S. PATENT DOCUMENTS 3,567,445 3/1971 Atkinson et al. ............... 430/302 X
4,268,609 5/1981 Shiba et al. ......................... 430/271
4,539,287 9/1985 Grossa et al. ....................... 430/300

FOREIGN PATENT DOCUMENTS 2306278 8/1974 Fed. Rep. of Germany .
2158869 6/1973 France .
81/01474 5/1981 PCT Int'l Appl. .................. 430/327

*Primary Examiner*—Charles L. Bowers, Jr.
*Attorney, Agent, or Firm*—Watson, Cole, Grindle & Watson

[57] ABSTRACT

The invention relates to a method of forming of a patterned photopolymer coating on a printing roller in which a photopolymer coating, present on said roller, and covered by a light-sensitive intermediate layer is exposed in a first stage to form an image of opaque and translucent parts in said intermediate layer.

Subsequently the photopolymer layer is exposed via the image formed in the intermediate layer, after which the photopolymer layer is developed.

Between abovementioned exposures, in case of a relatively thick, flexible, photopolymer, a period is waited to ensure that depressed parts of the photopolymer layer have returned to their original state.

The invention also relates to a printing roller thus obtained.

5 Claims, 2 Drawing Sheets

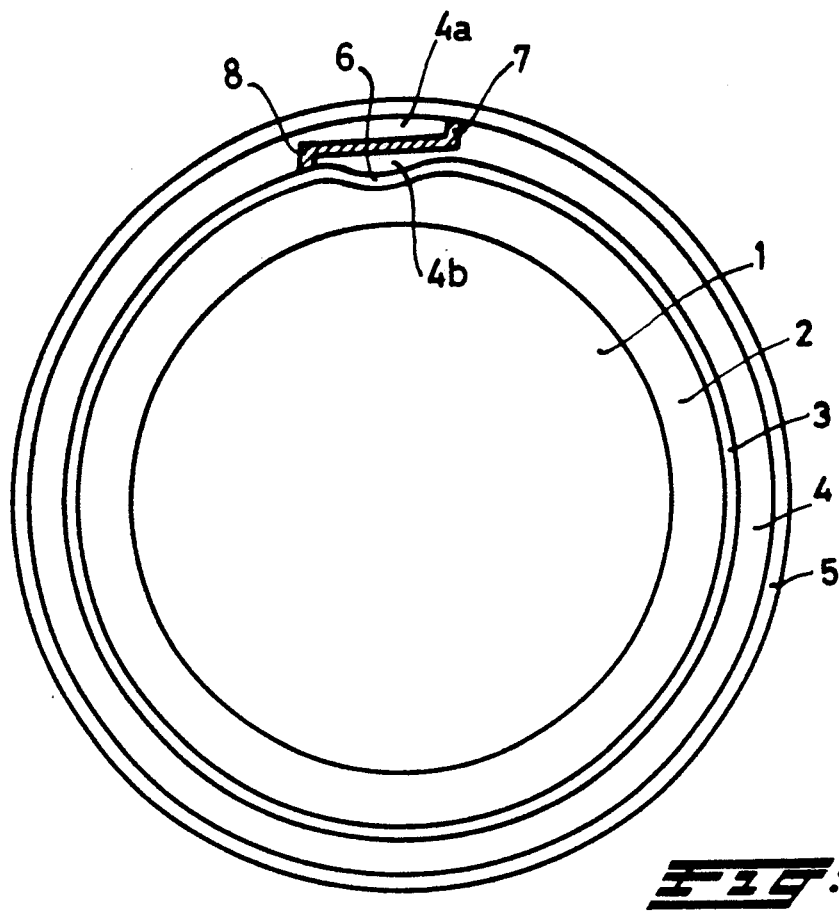
FIG:1.
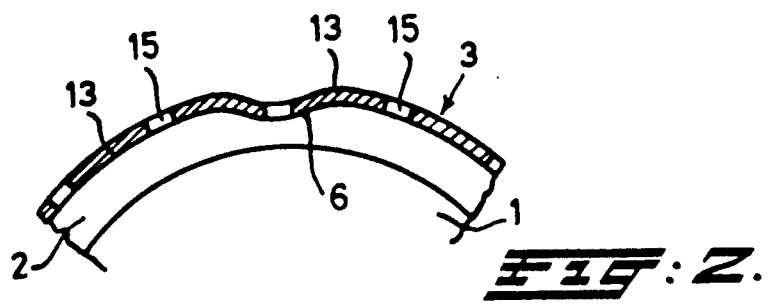
FIG:2.
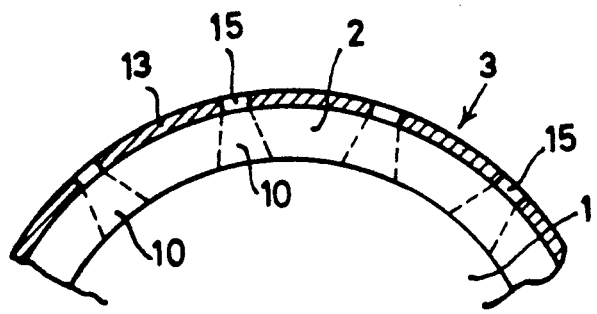
FIG:3.

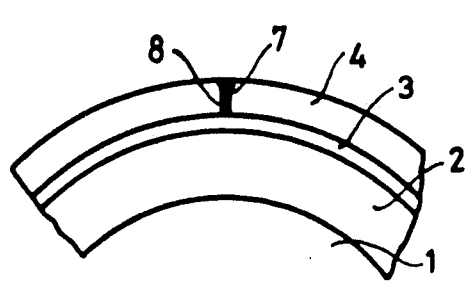
FIG: 4.
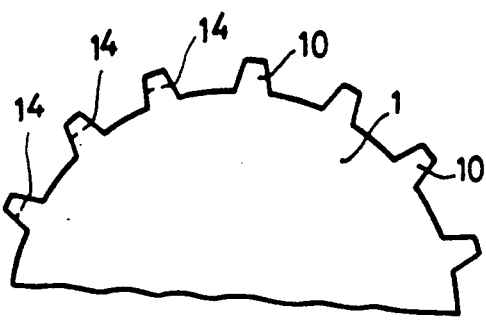
FIG: 5.
FIG: 6a.
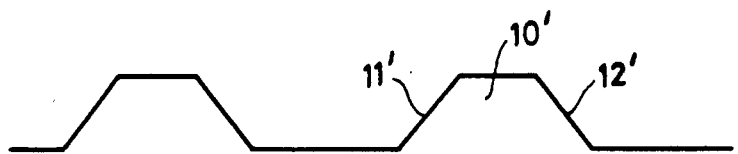
FIG: 6b.
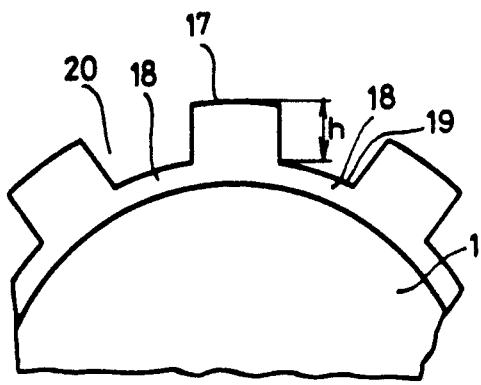
FIG: 7a.
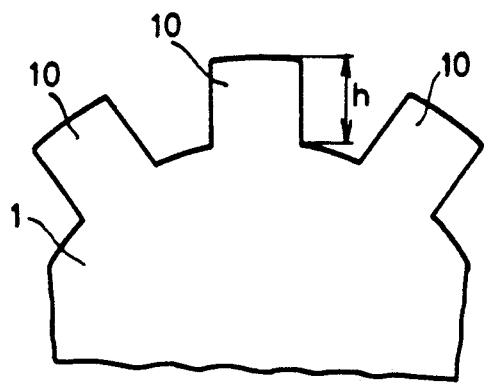
FIG: 7b.

METHOD FOR FORMING A PATTERNED PHOTOPOLYMER COATING ON A PRINTING ROLLER

This application is a continuation, of application Ser. No. 847,458, filed apr. 3, 1986, abandoned.

BACKGROUND OF THE INVENTION

The invention relates to a method of forming a patterned photopolymer coating on a printing roller in which a removable, light-sensitive, seamless intermediate layer, applied to the photopolymer layer and adhering closely thereto, is exposed and optionally developed in a first stage, essentially to form a desired patterned opaque image in the intermediate layer, and subsequently the photopolymer layer is exposed via the image formed in the intermediate layer, after which exposure the opaque intermediate layer parts and the soluble parts of the photopolymer layer are removed.

In a known method of this type the application of the patterning film with the edges abutting or overlapping around the printing roller coated with a photopolymer layer and then wrapping a thin layer of transparent film around the whole, under which film vacuum is created so that the patterning film is pressed against the photopolymer coating under uniform pressure, are known. In this state exposure is then carried out, whereafter the wrapping film and patterning film are removed.

The patterned printing roller is produced thereafter by washing out the soluble parts of the photopolymer coating present after the exposure.

In the case of a photohardening polymer these are the unexposed parts.

In the case of a photodecomposable polymer these are, however, the exposed parts.

Unwinding the patterning film along a rotating roller coated with a photopolymer layer and exposing at the position of the contact surface through a slit are also known.

In this known method, both when photohardening and when photodecomposable photopolymer coatings are used, imperfections in the patterning occur at the point of contact of the pattern, as a result of which the printing result at the position is influenced unfavourably.

In the case of a photohardening polymer and a patterning film with overlapping edges, the photopolymer layer, which is still somewhat elastic before exposure, is somewhat dented at the position of the overlap, which dent is fixed at the position of exposed parts by hardening.

In the case of a patterning film with abutting edges the light will be scattered or reflected at the position of the edge by the transparent parts of the pattern in the patterning film, as a result of which incomplete light transmission is brought about at the position. On the other hand, at the position of the edge some light will nevertheless be transmitted through the parts not intended to transmit light (i.e. black) of the pattern in the patterning film.

Both in the case of photohardening and in the case of photodecomposable photopolymer the phenomenon occurs at the position of the abutment edge that in the case of hard parts some material may nevertheless be washed away and that in the case of soft parts which can be washed out less is removed.

In the case of unwindable patterning film and slit exposure a double exposure always takes place at the junction of the pattern as a result of the slit width of the exposure slit, as a result of which the slope formation between exposed and unexposed parts of the polymer layer is influenced and deviations are produced as a result of the slope formation for single exposure in the rest of the pattern for both photohardening and photodecomposable photopolymer coating.

SUMMARY OF THE INVENTION

A primary object of the invention is now to provide a method for obtaining a patterned printing roller with photopolymer coating without a longitudinal zone having deviations in height, depth and slope formation of the patterning.

The above-mentioned object is achieved according to the invention- in that the photopolymer layer is constituted by a relatively thick, flexible photopolymer layer whereas in the first stage exposure is carried out, via a patterning film which has been applied around the said intermediate layer and after the first stage the patterning film is removed and exposure of the photopolymer layer is postpone until the depressed parts of the photopolymer layer have returned to their original state.

By a relatively thick, flexible photopolymer layer is meant a flexible photopolymer layer having a thickness from 1 to 10 mm; preferably a thickness from 2 to 5 mm.

In this manner a photopolymer coating pattern is obtained on a printing roller.

To obtain the desired image information in the seamless intermediate layer without substantial conversion of the parts of the photopolymer coating present below the seamless intermediate layer, it may be advisable to apply a light filter layer between the light-sensitive intermediate layer and the photopolymer layer surface.

In this manner it is possible to ensure that during the first exposure an image is only formed in the light-sensitive intermediate layer.

The light filter layer is expediently applied seamlessly to the photopolymer layer surface.

The light-sensitive intermediate layer may be a layer based on, for example, a diazo compound, a silver halide or a light-sensitive polymer and may be applied by spraying on, spreader coating or transfer coating.

The light-sensitive intermediate layer is expediently much more sensitive to a certain exposure than the photopolymer layer.

Particularly good results are obtained if light of different wavelengths is used for the exposure in the first and second step.

Light of the same wavelength can also be used for the exposure in the first and the second step, in which case, however, the intermediate layer is then much more sensitive to said light of a certain wavelength than the photopolymer layer.

The invention also relates to a printing roller with patterned photopolymer coating formed by exposure of the photopolymer coating via a patterning film pressed against the photopolymer coating, followed by removal of the patterning film and of soluble parts of the photopolymer coating which is characterized according to the invention in that the photopolymer coating obtained after washing out is free of a longitudinal zone of insoluble photopolymer parts having a lower clearance height and/or having different side widths than other comparable insoluble photopolymer parts.

In this case, by clearance height is meant the distance between the uppermost face of the insoluble polymer parts and the surface of an adjacently located recess.

As the result of the absence of insoluble photopolymer parts with a top face which does not lie on a cylindrical surface which includes the surfaces of the other insoluble photopolymer parts, the printing result of a printing roller of this type is considerably improved in comparison with the known printing roller.

If a photodecomposable photopolymer coating is used, the surfaces of the insoluble photopolymer parts lie on a cylindrical surface, while next to these photopolymer parts a polymer layer of the same thickness is at most always present in the recesses. This results likewise in a better printing result.

The same applies to photopolymer parts which all have virtually the same side width.

BRIEF DESCRIPTION OF THE DRAWINGS

FIG. 1 shows a section of a printing roller during its manufacture;

FIG. 2 shows a printing roller with photopolymer coating of the photohardening type and a depressed part of the photopolymer coating;

FIG. 3 shows the same photopolymer coating after restoration to the original state;

FIG. 4 shows a section of a photopolymer coating of the photohardening type with light-sensitive intermediate layer and a patterning film, the edges of which are up against each other in an abutting manner;

FIG. 5 shows a part of the surface of the printing roller with hardened parts of the photopolymer layer after washing out;

FIG. 6a shows the sides of the hardened parts of the photopolymer layer in the case of a printing roller according to the invention and obtained by the method of the invention;

FIG. 6b shows the same hardened parts obtained with a double exposure;

FIG. 7a shows a part of the surface of the printing roller on using a patterning film the edges of which lie against each other in an abutting manner obtained without a light-sensitive intermediate layer with a photodecomposable polymer;

FIG. 7b shows the same surface obtained with a light-sensitive intermediate layer.

DESCRIPTION OF THE PREFERRED EMBODIMENTS

In FIG. 1 a metal printing roller 1 is shown provided with a photopolymer coating of the photohardening type 2 of uniform thickness applied thereto.

On the surface of the photopolymer coating 2 there is applied a seamless light-sensitive intermediate layer 3 of a silver halide emulsion applied by means of a spreader. The light-sensitivity of this silver halide emulsion layer is approximately 100 times as great as that of the photopolymer coating. In general light-sensitive intermediate layers are employed which are approximately 3 to 200 times as sensitive as the light-sensitivity of the photopolymer coating.

Around the printing roller 1 with photopolymer coating layer 2 and light-sensitive intermediate layer 3 applied thereto there is applied a patterning film 4, the edges 7 and 8 of which overlap each other to form overlapping sections 4a and 4b. The whole is wrapped around with a transparent film layer 5 of a plastic material (such as polyvinyl chloride film) and a vacuum is then created under the film layer 5. As a result of this the patterning film 4 will be pressed against the surface of the somewhat elastic photopolymer coating 2. At the position of the overlapping parts 4a and 4b this results in depression 6 in the photopolymer layer.

If the light-sensitive intermediate layer 3 were not to be employed, exposed sections of the photohardening photopolymer layer in the depressed region would be hardened, as a result of which impressions would be fixed locally in a narrow transverse zone over the width of the patterning (see surface 14 in FIG. 5).

By making use of the light-sensitive intermediate layer 3, during exposure essentially only an image of the patterning film is transferred to the light-sensitive layer 3. After removal of the patterning film and of the wrapping film 5, a state is obtained such as shown in Figure 2 in which the light-sensitive intermediate layer 3 has exposed parts 13 and unexposed parts 15 in accordance with the pattern, the pattern, depending on the type of light-sensitive layer, having already been formed or being present as a latent image which becomes visible after development.

After a short time the depressed section 6 of the photohardening photopolymer layer will return to its original state, as a result of which the state as shown in FIG. 3 is obtained.

Exposure is then carried out for a second time, in which process parts 10 of the photopolymer layer 2 are hardened. After removal of the light-sensitive layer and unhardened parts of the photopolymer layer, a printing roller with a pattern formed from the hardened photopolymer layer parts 10 is obtained.

In FIG. 4 another embodiment is shown in which the edges 7 and 8 of the patterning film 4 fit against each other in an abutting manner. In that case no depression of the elastic photohardening photopolymer layer 2 occurs, but as a result of scattering the photopolymer parts to be exposed at the position of the abutting edges will be less exposed than other parts exposed to the same quantity of light. On washing out the photopolymer layer these polymer parts at the position of the abutting edges will also be washed out to some extent so that parts with a lower height than other parts will be obtained at that point (see surface 14 in FIG. 5).

In the case of a photodecomposable photopolymer layer parts to be exposed at the position of the abutment edge will also receive too little exposure, with the result that washing out takes place to a shallower depth. This is shown in FIG. 7a wherein 10 represents the unexposed parts and 18 the exposed parts if no light-sensitive intermediate layer is used.

FIG. 7b shows the result if a light-sensitive intermediate layer is in fact used.

In both the above-mentioned cases the light-sensitive intermediate layer 3 offers the, great advantage that these difficulties can be eliminated.

As already stated, the manufacturing of a printing roller with a pattern by rotating the roller bearing the photopolymer layer and unrolling the patterning film along the rotating roller while exposing through a slit is also already known. At the joint of the pattern a double exposure always takes place under these circumstances as a result of the slit width. In FIG. 6a a photopolymer layer part 10 hardened by a single exposure is shown with sides 11 and 12 which slope fairly steeply. With a double exposure of the same photopolymer layer part a hardened section 10' with sides 11' and 12', which slope much more gently, is obtained so that a greater side width is obtained in comparison with the embodiment according to FIG. 6a. This is avoided by a light-sensitive intermediate layer according to the invention.

The following example explains a certain embodiment.

EXAMPLE

To a printing roller 1 with a diameter of 50 cm a photopolymer coating layer 2 of, for example, Cyrel (Dupont) is applied by means of a spreader coating or by a sheet of this material wrapped around it, which is then fused together and accurately processed to obtain the correct diameter and roundness.

To the photopolymer layer a silver emulsion layer is applied as light-sensitive intermediate layer 3.

Around the whole a patterning film 4 is then applied in the manner as shown in FIG. 1 and then a wrapping film 5 of polyvinyl chloride, whereafter evacuation is carried out under the wrapping film 5 so that the patterning film is pressed against the photopolymer coating with light-sensitive layer.

Exposure is first carried out with light of a wavelength of 400-440 nanometers.

The wrapping film 5 and the patterning film 4 are then removed and the light-sensitive intermediate layer 3 is developed, as a result of which the image corresponding to that of the patterning film is formed therein.

After standing for some time, optionally in combination with a heat treatment, the seam has disappeared from the photopolymer coating 2, exposure is carried out a second time with light having a wavelength of 340 to 380 nanometers.

The remaining sections of the light-sensitive intermediate layer 3 originally applied and the unexposed parts of the photopolymer layer are then removed to a certain depth by washing out.

In order to limit the effect of the first exposure essentially to the light-sensitive intermediate layer 3 a filter layer 16 of a tinuvin compound (Ciba Geigy) which absorbs ultraviolet light can be applied with advantage between intermediate layer 3 and photopolymer coating 2.

What is claimed is:

1. A method of forming a printing roller with a patterned photopolymer coating thereon, said method comprising the steps of
   (1) providing a printing roller which includes a core and a flexible, seamless photopolymer layer on said core, said photopolymer layer having a thickness of between about 1 and 10 mm, the outer surface of said photopolymer layer being smooth and providing a normal contour,
   (2) applying a removable, light-sensitive, seamless intermediate layer over the photopolymer layer of said printing roller provided in step (1),
   (3) applying a patterning film having a certain pattern over said seamless intermediate layer such that opposite edges of said patterning film overlap each other to define an overlap area,
   (4) firmly pressing said patterning film against said intermediate layer, said patterning film causing a portion of said photopolymer layer in register with said overlap area to become depressed, thereby changing said normal contour of said photopolymer layer,
   (5) exposing said intermediate layer through said patterning film so as to form a latent image in said intermediate layer which corresponds to said certain pattern,
   (6) removing said patterning film from said intermediate layer,
   (7) developing said intermediate layer,
   (8) treating said photopolymer layer so that the photopolymer layer will return to its normal contour, said treating including heating said photopolymer layer,
   (9) exposing said photopolymer layer through said intermediate layer so as to form said desired pattern in said photopolymer layer,
   (10) removing said intermediate layer, and
   (11) removing soluble parts of said photopolymer layer to provide said printing roller with patterned photopolymer coating thereon.

2. The method as defined in claim 1, wherein in steps (5) and (9) light of different wavelength regions is used.

3. The method as defined in claim 1, wherein in steps (5) and (9) light of the same wavelength region is used.

4. The method as defined in claim 1, wherein said intermediate layer is made of a material which is more sensitive to light of a certain wavelength region than the material of said photopolymer layer.

5. The method as defined in claim 1, wherein between steps (1) and (2) a light filter layer is applied over the photopolymer layer of said printing roller.

* * * * *